United States Patent
Boernert et al.

(10) Patent No.: US 9,797,973 B2
(45) Date of Patent: Oct. 24, 2017

(54) MR IMAGING WITH EXTENDED FIELD OF VIEW

(75) Inventors: Peter Boernert, Hamburg (DE); Jochen Keupp, Rosengarten (DE); Peter Koken, Hamburg (DE); Kay Nehrke, Ammersbek (DE)

(73) Assignee: KONINKLIJKE PHILIPS ELECTRONICS N.V., Eindhoven (NL)

( * ) Notice: Subject to any disclaimer, the term of this patent is extended or adjusted under 35 U.S.C. 154(b) by 1621 days.

(21) Appl. No.: 13/000,386

(22) PCT Filed: Jun. 18, 2009

(86) PCT No.: PCT/IB2009/052606
§ 371 (c)(1),
(2), (4) Date: Dec. 21, 2010

(87) PCT Pub. No.: WO2010/001285
PCT Pub. Date: Jan. 7, 2010

(65) Prior Publication Data
US 2011/0112392 A1    May 12, 2011

(30) Foreign Application Priority Data
Jul. 4, 2008 (EP) .................................. 08159675

(51) Int. Cl.
*A61B 5/00* (2006.01)
*G01R 33/563* (2006.01)

(52) U.S. Cl.
CPC .. *G01R 33/56375* (2013.01); *G01R 33/56383* (2013.01)

(58) Field of Classification Search
CPC ...... G01R 33/56383; A61B 5/05; A61B 5/055
USPC .......................................................... 600/415
See application file for complete search history.

(56) References Cited

U.S. PATENT DOCUMENTS

| | | | |
|---|---|---|---|
| 5,748,700 A * | 5/1998 | Shepherd et al. | 378/65 |
| 6,897,655 B2 * | 5/2005 | Brittain et al. | 324/309 |
| 2006/0244451 A1 * | 11/2006 | Ni et al. | 324/320 |
| 2007/0145977 A1 | 6/2007 | Keupp et al. | |
| 2007/0222442 A1 | 9/2007 | Aldefeld et al. | |

FOREIGN PATENT DOCUMENTS

| | | |
|---|---|---|
| EP | 1362550 A1 | 11/2003 |
| EP | 1790286 A1 | 5/2007 |
| WO | 2004077086 A1 | 9/2004 |
| WO | 2006088453 A1 | 8/2006 |
| WO | WO 2006/111882 A2 * | 10/2006 ........... G01R 33/563 |

(Continued)

OTHER PUBLICATIONS

Riederer et al:"Long Field-of-View MRI Using Continuous Table Motion"; 2004 Proceedings of World Automation Congress, vol. 18, pp. 81-86.

(Continued)

*Primary Examiner* — Joel Lamprecht

(57) ABSTRACT

Magnetic resonance examination system comprises displaceable carrier for supporting an object to be examined. The carrier can be moved over a two dimensional area. The magnetic resonance examination system is configured to acquire sets of magnetic resonance signals from the object for various positions of the carrier in the two dimensional area.

16 Claims, 5 Drawing Sheets

(56) References Cited

FOREIGN PATENT DOCUMENTS

WO 2006118110 A1 11/2006
WO 2007010488 A2 1/2007

OTHER PUBLICATIONS

Aldefeld et al: "Continuously Moving Table 3D MRI With Lateral Frequency-Encoding Direction"; Magnetic Resonance in Medicine, 2006, vol. 55, pp. 1210-1216.
Kruger et al: "Continuously Moving Table Data Acquisition Method for Long FOV Contrast-Enhanced MRA and Whole-Body MRI"; Magnetic Resonance in Medicine, 2002, vol. 47, pp. 224-221.
Bornert et al: "Principles of Whole-Body Continuously-Moving Table MRI"; 2008, vol. 28, pp. 1-12.

* cited by examiner

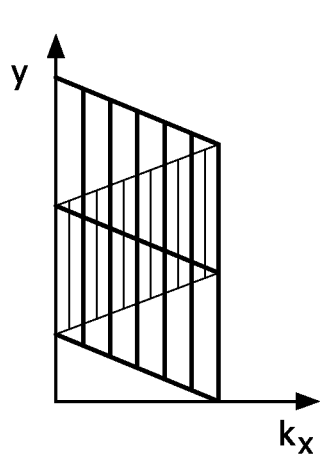
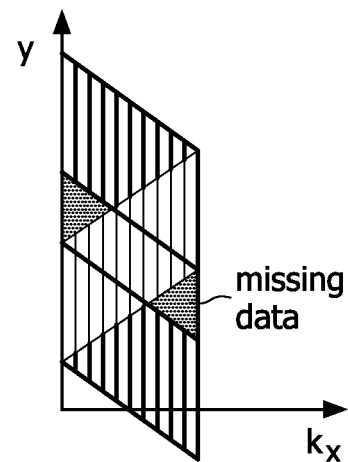
FIG. 6a          FIG. 6b
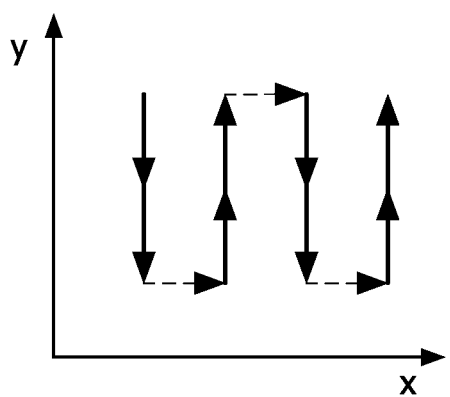
FIG. 7

MR IMAGING WITH EXTENDED FIELD OF VIEW

FIELD OF THE INVENTION

The invention pertains to a magnetic resonance examination system which is configured to move the object to be imaged.

BACKGROUND OF THE INVENTION

Such a magnetic resonance examination system is known from the international application WO2006/111882.

The known magnetic resonance examination system is has a mode of operation which involves a continuous moving table magnetic approach where a 'lateral' read out is performed that is transverse to the direction of motion. A sub-volume is excited by a spatially selective RF excitation which moves with the motion of the object for respective subsets of primary phase-encodings. Acquisition of magnetic resonance signals is performed from a three-dimensional sub-volume of the object. The magnetic resonance signals are read encoded in a direction transverse to the direction of motion of the object and phase-encoded in at least the direction of motion of the object. In this way the coverage for imaging of the magnetic resonance examination system is extended.

SUMMARY OF THE INVENTION

An object of the invention is to enlarge the coverage for imaging of the magnetic resonance examination system.

This object is achieved in a magnetic resonance examination system of the invention comprising an acquisition system to acquire magnetic resonance signals a displaceable carrier for supporting an object to be examined a controller for controlling the acquisition system and the carrier, the magnetic resonance examination system being configured in order to displace the carrier over a two dimensional area acquire sets of magnetic resonance signals from the object for various positions of the carrier in the two dimensional area.

According to the invention, the carrier with the object, i.e. the patient to be examined is moveable in two independent spatial directions. These two degrees of freedom to displace the object enable to position various portions of the object in the imaging zone of the magnetic resonance examination system. The imaging zone is the spatial region where good image quality is achieved. Notably, in the imaging zone the magnetic resonance examination system has a main magnetic field that is spatially homogeneous to a very high degree and encoding gradient magnetic fields have a field strength that is accurately spatially linear. Often, the imaging zone is smaller than the object to be examined. In practice, the imaging zone has a size of about 300-500 mm. According to the invention, sets of gradient encoded (read encoded and phase encoded) magnetic resonance signals are acquired fro different positions of the carrier relative to the imaging zone. That, is for different positions of the carrier, the field of view covers a different part of the object. The invention allows to image large parts, or even the entire object to be imaged at high image quality. Notably, the magnetic resonance examination system of the invention is advantageous for performing a whole body examination of a patient to be examined. Notably, the magnetic resonance examination system of the invention makes it easy to move different parts of the object into the imaging zone for a comprehensive examination of the object, i.e. the patient to be examined.

Advantageously, the invention is implemented in a so-called open-type magnetic resonance examination system. The open-type magnetic resonance examination system has two magnetic poles (or pole shoes) between which there is the main magnetic field. The imaging zone is located between the magnetic poles. According to the invention, the object can be moved freely in two dimensions, notably the movement is in a plane transverse to the main magnetic field direction between the two magnetic pole shoes.

According to one aspect of the invention, the carrier (with the object, i.e. the patient to be examined) is positioned at successive positions. At the respective positions the carrier is kept stationary and a set of magnetic resonance signals for that position is acquired. This is a multi-station approach in which for each station a set of magnetic resonance signals is acquired. During displacement of the carrier acquisition of magnetic resonance signals is interrupted. Subsequently, image data sets for the respective carrier positions are reconstructed from each of the sets of magnetic resonance signals. These reconstructed images are then combined into an image of a larger part of the object or even of the whole object. This two-dimensional multi-station approach is easy to implement because actual acquisition of magnetic resonance signals is done while the carrier is stationary. Only minor adaptations to the acquisition of magnetic resonance signals or reconstruction of the magnetic resonance image is required as compared to single station or stationary signal acquisition. Accurate information on the positions of the carrier is required in order to merge the image datasets without artifacts.

According to another aspect of the invention for respective lateral positions of the carrier, the carrier is continuously moved along a continuous motion direction while magnetic resonance signals are being acquired. Respective lateral positions are displaced transversely to the direction of continuous motion. That is, a one dimension multi-station approach (in the lateral direction) is combined with a continuously moving carrier approach in the continuous motion direction. Preferably, the lateral coverage of the continuously moving carrier acquisition is at least the step width in the lateral direction between adjacent lateral positions of the carrier. Thus, the entire lateral extension of the object can be covered without leaving out portions of the object between different lateral positions of the carrier.

According to another aspect of the invention, magnetic resonance signals are acquired during continuous motion of the carrier along two independent directions. In this way the displacement of the carrier is done in a smooth way which is easily tolerated by or even comfortable for the patient to be examined.

According to a further aspect of the invention, frequency encoding is applied in direction transverse to the direction of continuous motion of the carrier during acquisition of magnetic resonance signals. In this implementation, phase-encoding is applied along a direction transverse to the direction of continuous motion. Frequency encoding and phase encodings are performed by applying temporary gradient magnetic field across the imaging zone. This acquisition approach allows upon inverse Fourier transformation to place acquired data into so-called hybrid space (one spatial direction, and one or two k-space directions) which permits to displace these once transformed data along the direction of continuous motion. Upon completion of the acquisition of magnetic resonance signals for all phase encodings for each position of the carrier along the continuous motion direction, transformation along the phase-encoding direction(s) can be performed. In this way the reconstruction can be built up line by line (of the image) as the object progresses along the direction of continuous motion. In this implementation the carrier is moved in two directions. As the carrier is moved in a first continuous motion direction an acquisition in hybrid space as discussed above is carried out. For each position in the first continuous motion direction acquisitions for successive positions along the second continuous motion direction are applied where the frequency encoding is transverse to the second continuous motion direction.

According to another aspect of the invention, frequency encoding is applied transverse to the direction of continuous motion. Notably, frequency encoding is applied transverse to both independent continuous motion directions. As a result, phase encodings are applied parallel to the direction of continuous motion and frequency encoding is applied along the direction transverse to the 2D plane in which the carrier is displaced.

According to a further aspect of the invention the frequency encoding is switched when the direction of continuous motion is altered. That is, in this implementation the carrier is moved in two continuous motion directions. As the carrier is moved in a first continuous motion direction an acquisition in hybrid space as discussed above is carried out. For each position in the first continuous motion direction, acquisition for successive positions along the second continuous motion direction are applied hybrid space acquisitions are made with the frequency encoding switched along the second continuous motion direction.

According to another aspect of the invention oversampling of the magnetic resonance signals along one or both directions of displacement of the carrier is applied. The oversampling allows to avoid aliasing or folding in of magnetic resonance signals from regions that are in the neighborhood the part of the object that is currently in the imaging zone. Preferably, oversampling is applied in both continuous motion directions to reduce artifacts due to imperfect signal suppression or imperfect slab selection transverse to the frequency encoding directions.

According to a further aspect of the invention the carrier is displaced along opposite directions along one of the continuous motion directions. This approach does not require a complete 'roll back' of the carrier to its initial position along one or the continuous motion direction with magnetic resonance signals being acquired. That is, the carrier can progress along a meandering trajectory in which progress along opposite directions along one of the continuous motion directions is alternated with progress of the carrier along the other continuous motion direction. Consequently, efficient acquisition of the magnetic resonance signals is achieved with only little idling while the carrier is moved. Also progress in opposite directions along both continuous motion directions is feasible.

According to another aspect of the invention slab selection and/or magnetization suppression is performed to select a slab along the direction of motion of the carrier. The slab selection progresses with the displacement of the carrier. This approach suppresses folding-in or aliasing artifacts from regions that are neighboring to the selected slab.

The invention also pertains to a magnetic resonance examination method as defined in Claim 12. The magnetic resonance imaging method of the invention achieves to enlarge coverage of the region of the object that is examined with a low artifact level. The invention is notably applicable for diagnostic magnetic resonance imaging. The invention can also be applied for magnetic resonance spectroscopy applications in which magnetic resonance spectroscopic information is acquired for various parts of the object as the carrier is moved along various positions.

The invention further relates to a computer program as defined in Claim 13. The computer program of the invention can be provided on a data carrier such as a CD-rom disk or a USB memory stick, or the computer program of the invention can be downloaded from a data network such as the world-wide web. When installed in the computer included in a magnetic resonance imaging system the magnetic resonance imaging system is enabled to operate according to the invention and achieve a wider coverage.

These and other aspects of the invention will be further elaborated with reference to the embodiments defined in the dependent Claims.

These and other aspects of the invention will be elucidated with reference to the embodiments described hereinafter and with reference to the accompanying drawing wherein

BRIEF DESCRIPTION OF THE DRAWINGS

FIG. 4 (c) shows the spatial acquisition trajectory of a timing pattern, which covers the two motion dimensions densely enough allowing for seamless filling of the 3D hybrid space;

FIG. 4 (d) shows the y-$k_x$ hybrid space representation of the spatial acquisition trajectory of FIG. 4c FIGS. 5 a-c show another spatial acquisition trajectories FIG. 5 (d) shows the y-$k_x$ hybrid space representation of the spatial acquisition trajectory of FIG. 5c FIG. 6 schematically shows hybrid space under-sampling in the $k_x$ direction;

FIG. 7 shows the temporal order of table move intervals for a meander-like trajectory.

DETAILED DESCRIPTION OF THE EMBODIMENTS

Figure 8:
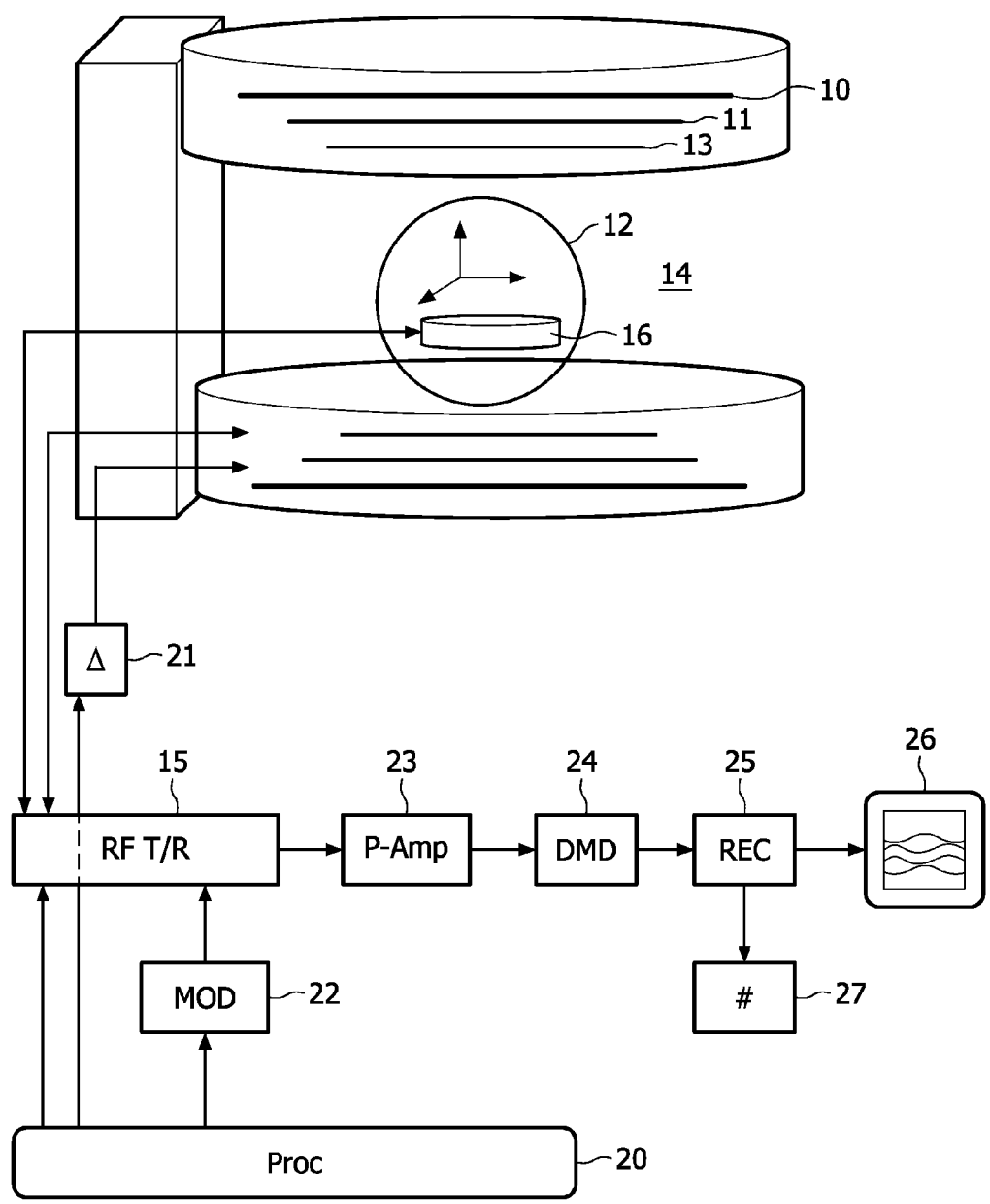
FIG. 8 shows diagrammatically a magnetic resonance imaging system in which the invention is used.

FIG. 8 shows diagrammatically a magnetic resonance imaging system in which the invention is used. The magnetic resonance imaging system includes a set of main coils 10 whereby the steady, uniform (main) magnetic field is generated. The main coils are constructed, for example in such a manner that they form two pole shoes in between which the main coils generate the main magnetic field. In such an open type magnetic resonance examination system the main magnetic field is usually in the vertical (z) direction. The examination space 14 is located in between the two pole shoes. The patient to be examined is placed on a patient carrier (not shown) which is slid into the examination space. Around the isocentre of the magnet system, i.e. in the imaging volume 12, there are the best spatial uniformity of the main magnetic field and very accurately linear gradient magnetic fields. Thus, in the homogeneity volume magnetic resonance images are acquired with a very low artifact level. The magnetic resonance imaging system also includes a number of gradient coils 11 whereby magnetic fields exhibiting spatial variations, notably in the form of temporary gradients in individual (x,y and z) directions, are generated so as to be superposed on the uniform magnetic field. The gradient coils 11 are connected to a gradient control 21 which includes one or more gradient amplifier and a controllable power supply unit. The gradient coils 11 are energized by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil 13 of which the RF field to excite spins extends over the homogeneity volume and a large part of the examination space. In receive mode, the body coil, has a sensitivity volume that extends into a large zone in the examination space and includes the imaging zone 12. The body coil is usually arranged in the magnetic resonance imaging system in such a manner that the patient to be examined is arranged on the carrier (not shown) in the examination space can be moved in the (x,y) directions transverse to the main field direction, i.e. usually in the horizontal plane. Thus, respective portions of the patient to be examined can be moved in to the imaging zone. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. Furthermore, the transmission and receiving coil is usually shaped as a flat coil, but other geometries where the transmission and receiving coil acts as a transmission and receiving antenna for RF electromagnetic signals are also feasible. The transmission and receiving coil 13 is connected to an electronic transmission and receiving circuit 15.

It is to be noted that it is alternatively possible to use separate receiving and/or transmission coils 16. For example, surface coils 16 can be used as receiving and/or transmission coils. Such surface coils have a high sensitivity in a comparatively small volume. The receiving coils, such as the surface coils, are connected to a demodulator 24 and the received magnetic resonance signals (MS) are demodulated by means of the demodulator 24. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. The demodulated magnetic resonance signals (DMS) are applied to a reconstruction unit. Furthermore, the transmission and receiving circuit 15 is connected to a modulator 22. The modulator 22 and the transmission and receiving circuit 15 activate the transmission coil 13 so as to transmit the RF excitation and refocusing pulses. In particular the surface receive coils 16 are coupled to the transmission and receive circuit by way of a wireless link. Magnetic resonance signal data received by the surface coils 16 are transmitted to the transmission and receiving circuit 15 and control signals (e.g. to tune and detune the surface coils) are sent to the surface coils over the wireless link.

The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction unit 25 is applied to a monitor 26, so that the monitor can display the magnetic resonance image. It is alternatively possible to store the signal from the reconstruction unit 25 in a buffer unit 27 while awaiting further processing.

The magnetic resonance imaging system according to the invention is also provided with a control unit 20, for example in the form of a computer which includes a (micro) processor. The control unit 20 controls the execution of the RF excitations and the application of the temporary gradient fields. To this end, the computer program according to the invention is loaded, for example, into the control unit 20 and the reconstruction unit 25.

The magnetic resonance examination system of the invention can be operated in various modes as will now be elaborated in more detail.

2D Multi-station Approach

This is a simple extension of the currently used 1-dimensional extended FOV approach to two directions (axial and lateral) of motion. Conventional 2D/3D imaging is performed while the table is at rest. Slab selection and, if necessary, regional signal suppression, achieved by magnetization preparation applied perpendicular to the slice and frequency encoding direction, is used. In this example, frequency encoding is applied in the y-direction and slab selection along x. The object dimensions are assumed to exceed the imaging FOV of the actual sampling scheme. Therefore, in both directions over-sampling is performed. This is straightforward in frequency encoding direction and improves the performance of the anti-aliasing filters. In the slab direction more phase encoding steps have to be measured to compensate for imperfections of the slab selection process. Consequently, the effective FOV of such an elementary image acquisition is slightly smaller than the nominal one, which has to be taken into consideration during the sequence design.

Figure 1A:
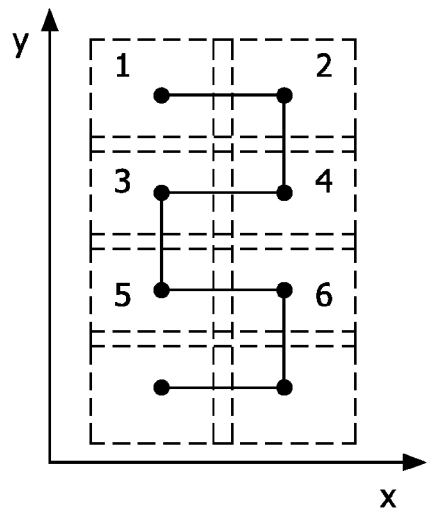
In FIG. 1 an example for table/carrier trajectories or trajectories of the moving object to be examined are given for the multi-station approach.
Figure 1B:
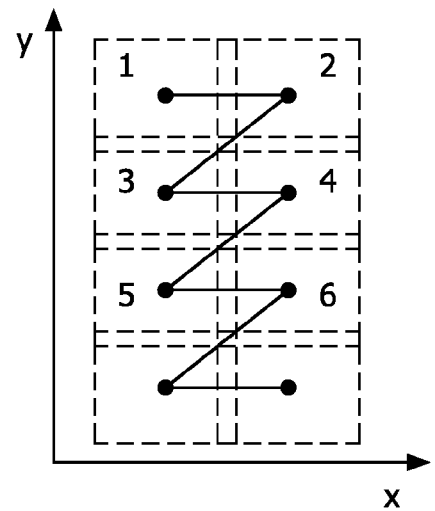

To cover an extended FOV by such a multi-station acquisition different two-dimensional table-motion trajectories are considered. In FIG. 1 examples for these trajectories are given. During patient table motion scanning is interrupted. The table moves after completion of each sub-data set acquisition. This movement has to be performed in an efficient way and has to be tolerated by the patient. The individual sub-data sets are reconstructed subsequently. Important is the image combination process, which includes some image fusion in the two dimensions. For this purpose image reconstruction for a larger FOV (and image matrix) is performed enabled by signal over-sampling.

2D Merged Multi-station/Continuously Moving Table Imaging

Figure 2:
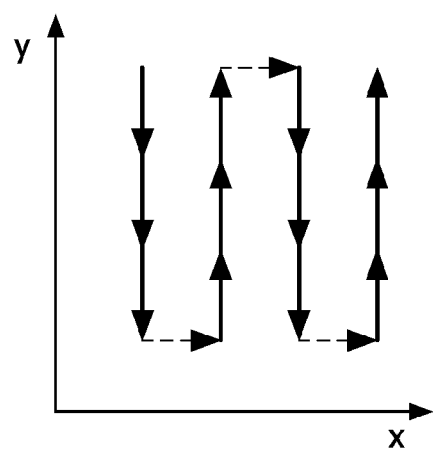
FIG. 2 shows a multi-station approach while per station the carrier is moved in one-dimension.

An extended spatial coverage in two spatial dimensions can be achieved by merging a one-dimensional multi-station with any one-dimensional continuously moving table (COMTI) approach. The result is a multi-station scanning approach covering an object e.g. along the x direction, while per station 1D continuously moving table sampling is performed covering the object over an extended FOV in the y-direction. In FIG. 2 such an acquisition scheme is schematically shown. For the continuously moving table scheme a so-called Kruger-Riederer scheme (K/R), which performs frequency encoding along the direction of table motion, and a lateral encoding scheme (Mobi-X), in which frequency encoding is performed perpendicular to the motion direction, or any other approach can be used. The COMTI scan has to cover in the x-direction an area, which corresponds to the step width of the multi-station scheme. Therefore, in these experiments the FOVs in the corresponding phase encoding directions have to be adjusted to make sure, that the entire sensitive volume of the scanner is covered avoiding any form of fold-over. Regional signal suppression could be employed for this purpose, too, improving the performance and/or minimizing the effective FOV to be encoded for the COMTI scans.

2D Continuously Moving Table Imaging

Figure 3A:
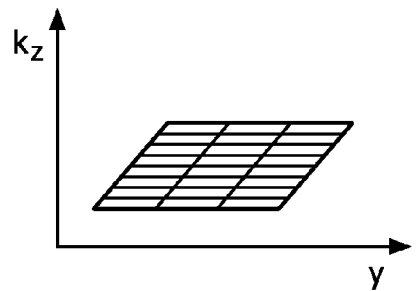
FIGS. 3a and 3b illustrate how data acquisition is performed in the hybrid space (1)
Figure 3B:
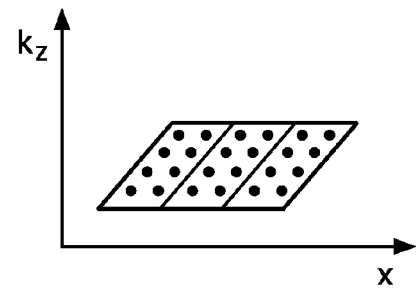
Figure 4A:
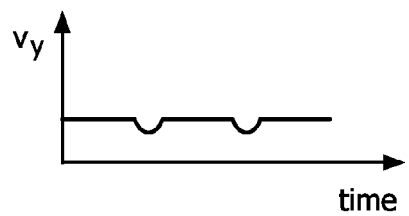
FIG. 4 (a,b) shows the table velocity in y-, x-direction, respectively.
Figure 4B:
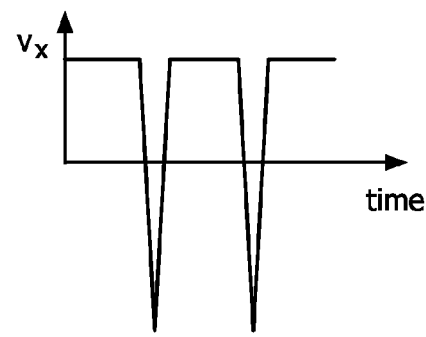
Figure 4C:
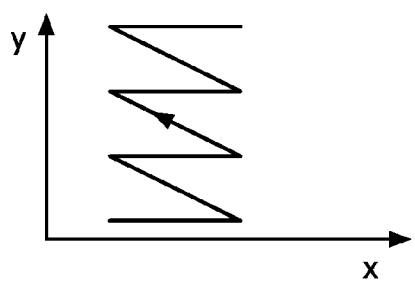
Figure 4D:
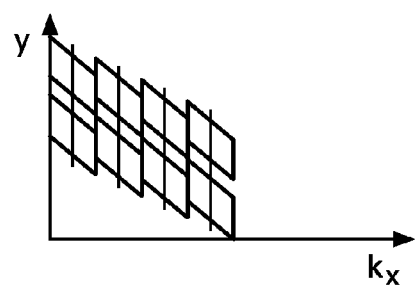
Figure 5A:
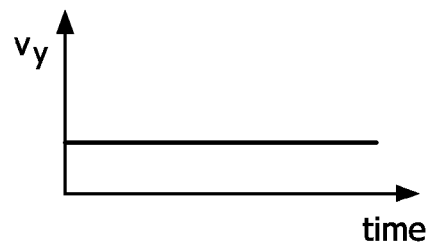
Figure 5B:
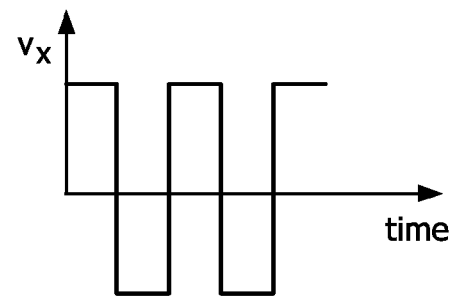
Figure 5C:
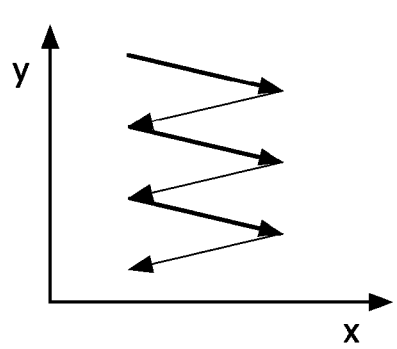
Figure 5D:
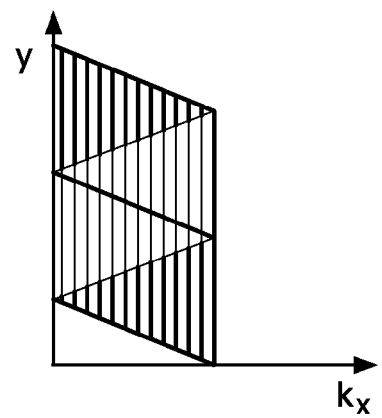

A virtual FOV enlargement in two spatial dimensions purely based on COMTI technology can be considered as well. In the COMTI schemes considered here data acquisition is performed in the hybrid space [1], which contains in case of one-dimensional COMTI one spatial dimension (along the motion direction) and the remaining k-space dimensions. Due to table motion, this space is sheared into the moving table direction. The shearing comes from the fact, that basically all data are acquired in the isocenter region, the most homogenous region, of a scanner. However, due to table motion the profiles measured there refer to different object positions. The shearing results into a small missing data problem at the beginning and at the end of the hybrid space data set. This is the case regardless if frequency or phase encoding is applied in the motion direction (1, 2), as illustrated in FIG. 3.

In Cartesian MR imaging exist only one frequency encoding direction. In all other remaining directions phase-encoding is applied. Usually, these orientations are not changed during an image acquisition. Now table motion in two directions should be investigated. Restricting ourselves to Cartesian sampling for the moment, one can distinguish between two cases:

(A) the two table motion directions are aligned with the frequency and the phase encoding direction or (B) both are aligned to the two phase encoding directions.

At first case (A) is considered.

Generalized Mobi-X or Kruger-Riederer Approach (A)

The patient table motion directions are assumed to be orthogonal to each other. Assume y to be the frequency encoding direction and x the first phase encoding one. 3D signal sampling is considered, with the third dimension neglected for the moment. If table motion takes place in the two directions (x, y) simultaneously, the Mobi-X or Kruger-Riederer scheme can be applied in a combined manner in a generalized form. This means, during a conventional K/R data acquisition with the frequency encoding direction oriented along the y axis, a Mobi-X acquisition is running in the inner loop. Thus, the Mobi-X data acquisition can be considered to be almost independent from the K/R scheme, just as a special phase encoding regime of a conventional Kruger-Riederer approach. Consequently, the phase encoding direction in the K/R comprises all phase encoding steps in the second motion direction according to the total encodings in the Mobi-X loop (including potential over-sampling). Slab tracking is performed as usually in Mobi-X along the motion direction oriented in x. Data representation can be done in a 3D hybrid space, which is sheared in two directions. In FIG. 3 two views on the 3D hybrid data set acquired in such an experiment are shown.

Performing a scan in this scheme allows establishing some constraints to the table velocities and the table motion pattern. In the current scenario the table moves faster in x than in the y-direction. The velocity $v_x$ can be given according to [2] as $$v_x = \frac{L_x d_x}{N_y N_z T_R} \quad [1]$$

$L_x$ denotes the excited slab-thickness, $d_x$ the pixel's x-dimension, $N_y$ and $N_z$ the number of phase encoding steps applied in these directions to sample the data for one elementary field of view (FOV). Please note that the numbers of phase encodings includes the steps necessary for compensate for problems in the slice excitation and that the number of total phase encoding steps to cover the desired virtual FOV=$L_x f_x$ in the x-direction has be increased by the factor $f_x$.

The table velocity in the y-direction is accordingly given by the total number of phase encoding steps necessary to acquire the data for a single elementary FOV in y-direction:

$$v_y = \frac{L_y d_y}{f_x N_y N_z T_R}. \quad [2]$$

The index y denotes the direction dependent values. For such an acquisition scheme a logical table motion pattern can be given (c.f. FIG. 4). FIG. 4 (a,b) shows the table velocity in y-, x-direction, respectively. FIG. 4 (c) shows the spatial trajectory of this timing pattern, which covers the two motion dimensions densely enough allowing for seamless filling of the 3D hybrid space. In contrast FIG. 4 (d) shows the y-$k_x$ hybrid space representation for the K/R part, showing the Mobi-X acquisition only as the number of total phase encoding steps to be performed. After one complete Mobi-X acquisition cycle the table rolls back very quickly to the original x position to start a new run. The small time periods necessary to achieve this back-roll are neglected in the equation [1,2]. This approach needs a periodical back-roll of the table, which could result into some patient discomfort and a loss of sampling efficiency.

Other spatial sampling trajectories than the one given in FIG. 4 (c) are possible. Such a scheme is illustrated in FIG. 5 (a-d). Instead of performing a complete roll-back after a complete Mobi-X acquisition the table velocity vx can simply be reversed (c.f. FIG. 5 (b)), driving the table slowly back to the x-start position, while data acquisition is continued. In the case shown in FIG. 5 $v_y$ is halved with respect to its nominal value derived from Eq. [1]. The corresponding y-$k_x$ hybrid space representation is shown in FIG. 5 (d). It is visible and important to note, that in this scheme hybrid space is sampled twice which corresponds to some kind of signal averaging. Basically, this hybrid space comprises two sub-spaces, the back and forth sampled one. Such a scanning approach would be inefficient from a sampling point of view. A more appropriate approach includes hybrid space under-sampling in the kx direction and is schematically demonstrated in FIG. 6 (a). this is accompanied by a loss of performance due to the halved $v_y$ table speed, which can be compensated to regain scan efficiency. However, the reconstruction of these data might become more complicated in a real setting. The two back and forth sampled data sets could be reconstructed to some extent separately and data combination could be done in the spatial domain including some zero- and first-order phase correction. The main problem in this reconstruction approach however consists in the fold-over problem in the x-direction. This problem could be avoided by treating the Mobi-X data as a single data set. Exact timing or precise table position information is necessary in this case to avoid any artifact arising from merging the two sub-sampled data sets in the kx direction.

Other sampling schemes could be considered as well. One can do without sub-sampling trying to compensate for the loss of scan efficiency by using different ratios $$\frac{v_y}{v_y}.$$

FIG. 6(b) illustrates such a case. There are regions in hybrid-space, which are covered twice and those which are not covered at all. The redundant information can be used to derive some corrections in between the back and forth data sets, which could be helpful to improve image quality. The gaps, in hybrid space on the other hand could be filled in some cases by appropriate half-Fourier or other types of image reconstruction.

The case (B) can be treated in a similar manner.

Generalized Mobi-X Approach (B)

In this case basically two nested Mobi-X schemes have to be considered while frequency encoding is performed along the third dimension. In principle the same argumentation as given above holds, with the difference that in the figures used before the spatial coordinate y has to be replaced by $k_y$. The only problem remaining is that a Mobi-X scheme needs a slab selection along the motion direction, which is tracked during the scan progress (2). However, in gradient echo type acquisitions only one selection pulse is available. This is not the case in SE-acquisition but those are often limited by TR constraints. To overcome these limitations for gradient echo scanning, regional magnetization suppression (REST) might be employed to suppress the magnetization from outside the second slab direction in such a magnetization prepared turbo-field echo scenario.

However, the applicability of this scheme could be limited. The main question is if read-out in the z-direction is efficient for the spatial dimension and the resolution desired in this direction. Frequency encoding is the most efficient encoding approach and should be applied in the direction which is the most demanding one with respect to the numerical resolution.

The remaining case (C) should be treated very briefly in the following.

Generalized Kruger Riederer Approach (C)

The basic idea of this 2D moving table approach is to nest two Kruger Riederer acquisitions. In the K/R approach frequency encoding is applied along the motion direction. As already mentioned, in a MRI experiment there is only one frequency encoding direction available. Consequently, table motion in this approach has to be performed in a sequential manner for the two directions. Toggling the table velocity between $v_y$ and $v_x$ is then associated with a toggling of the frequency encoding direction. The hybrid space for this kind of acquisition has some kind of a patchwork structure. The corresponding pseudo hybrid-space can show some gaps and redundant coverage making this approach potentially not very advantageously. Just as an example FIG. 7 shows the temporal order of table motion intervals for a meander-like trajectory. Also in these experiments the FOV in the phase encoding directions have to be adjusted as to cover the entire sensitive volume of the scanner to avoid any forms of fold-over. Regional signal suppression could help to minimize the effective FOV to be encoded.

The invention has practical advantages in examination of the patient's abdomen where the nominal size of the field of view (for one individual position of the carrier) is limited to 500 mm. The present invention easily allows the virtual field of view to be extended to 800 mm in the feed head direction and to 600 m is the left right direction.

REFERENCES

1. Kruger D G, Riederer S J, Grimm R C, Rossman P J. Magn Reson Med 2002; 47: 224-231.
2. Aldefeld B, Börnert P, Keupp J. Magn Reson Med 2006; 55: 1210-16.

The invention claimed is:

1. A magnetic resonance examination system, comprising:
an acquisition system configured to acquire magnetic resonance signals;
a displaceable carrier configured to support an object to be examined; and
a controller configured to control the acquisition system and the carrier, and further configured to:
move the carrier along a continuous motion direction in a two dimensional area,
shift the carrier along a direction transverse to the continuous motion direction to respective lateral positions, and
for respective lateral positions, acquire a set of magnetic resonance signals during continuous motion of the carrier along the continuous motion direction.

2. The magnetic resonance examination system of claim 1 and further having two magnetic poles between which a main magnetic field extends.

3. The magnetic resonance examination system of claim 1, wherein the controller is configured to apply oversampling of the acquired magnetic resonance signals in the direction transverse to the continuous motion direction of the carrier.

4. The magnetic resonance examination system of claim 1, wherein the controller is further configured to apply oversampling along at least one phase encoding direction.

5. The system of claim 1, wherein each set of magnetic resonance signals corresponds to a field of view, and wherein the controller is configured to acquire magnetic resonance signals corresponding to a plurality of fields of view including at least a first field of view and a second field of view which are displaced with respect to each other in the continuous motion direction, and at least a third field of view and a fourth field of view which are displaced with respect to each other in the direction transverse to the continuous motion direction.

6. The magnetic resonance examination system of claim 1, wherein the continuous motion direction is a first linear direction and the direction transverse to the continuous motion direction is a second linear direction orthogonal to the first linear direction, wherein the object to be examined has a width which extends in the second linear direction, and wherein the controller is configured to move the carrier, for each of the respective lateral positions, linearly along the first linear direction to acquire the set of magnetic resonance signals which span less than the entire width of the object to be examined.

7. The magnetic resonance examination system of claim 6, wherein the sets of magnetic resonance signals acquired for all of the respective lateral positions together span the entire width along the second linear direction of the examination area be imaged.

8. A method of operating a magnetic resonance examination system which employs a carrier configured to support an object to be examined, the method comprising:
    acquiring a plurality of sets of magnetic resonance signals from the object for various positions of the carrier in two dimensions, wherein at least a first one of the positions and a second one of the positions are displaced with respect to each other in a first direction, and wherein at least the first one of the positions and a third one of the positions are displaced with respect to each other in a second direction which is orthogonal to the first direction.

9. The method of claim 8, comprising:
    acquiring a first group of the sets of magnetic resonance signals while continuously moving the carrier along the first direction,
    shifting the carrier in the second direction after acquiring the first group of the sets of magnetic resonance signals, and
    after shifting the carrier in the second direction, acquiring a second group of the sets of magnetic resonance signals while continuously moving the carrier along the first direction.

10. The method of claim 8, comprising:
    (a) acquiring a first one of the sets of magnetic resonance signals while the carrier is in a first position,
    (b) shifting the carrier in the first direction to a next position, and then acquiring another one of the sets of magnetic resonance signals at the next position,
    (c) shifting the carrier in the second direction to another position, and then acquiring another one of the sets of magnetic resonance signals at the other position, and
    repeating steps (b) and (c) until magnetic resonance signals are acquired from an entire area which is to be imaged of the object.

11. The method of claim 8, further comprising continuously moving the carrier in the two dimensions while acquiring the plurality of sets of magnetic resonance signals from the object.

12. The method of claim 8, comprising:
    acquiring a first group of the sets of magnetic resonance signals while continuously moving the carrier along a linear path in the first direction;
    shifting the carrier orthogonal to the first direction after acquiring the first group of the sets of magnetic resonance signals; and
    after shifting the carrier orthogonal to the first direction, acquiring a second group of the sets of magnetic resonance signals while continuously moving the carrier along the first direction;
    wherein the sets of magnetic resonance signals are acquired with a first frequency coding along the first direction, and a second frequency coding along the second direction.

13. The method of claim 8 wherein the object to be examined has a width which extends in the second linear direction, the method comprising:
    (a) acquiring a first group of the sets of magnetic resonance signals while continuously linearly moving the carrier along the first direction, the first group of the sets of magnetic resonance signals spanning less than an entire width of the object;
    (b) shifting the carrier orthogonal to the first direction after acquiring the first group of the sets of magnetic resonance signals; and
    (c) after shifting the carrier orthogonal to the first direction, acquiring a second group of the sets of magnetic resonance signals while continuously linearly moving the carrier along the first direction, the second group of the sets of magnetic resonance signals spanning less than the entire width of the object.

14. The method of claim 13, further comprising repeating steps (b) and (c) to acquire sets of magnetic resonance signals which span the entire width of the examination area of the object in the second direction.

15. The method of claim 8, comprising:
    (a) acquiring a first one of the sets of magnetic resonance signals while the carrier is in a first position,
    (b) shifting the carrier in the first direction to a next position, and then acquiring another one of the sets of magnetic resonance signals, and
    (c) shifting the carrier orthogonal to the first direction to another position, and then acquiring another one of the sets of magnetic resonance signals at the other position.

16. A non-transitory data carrier having stored thereon computer program instructions for causing a controller of a magnetic resonance examination system to:
    (a) acquire a set of magnetic resonance signals from an object to be examined while a carrier supports the object;
    (b) translate the carrier in a first direction in a two dimensional space, and then acquire another set of magnetic resonance signals from the object,
    (c) translate the carrier in a second direction in the two dimensional space, and then acquire a next set of magnetic resonance signals from the object, where the second direction is orthogonal to the first direction; and
    repeat steps (b) and (c) until magnetic resonance signals are acquired from an entire area which is to be imaged of the object.

* * * * *